(12) United States Patent
Lou et al.

(10) Patent No.: US 10,446,589 B2
(45) Date of Patent: Oct. 15, 2019

(54) ARRAY SUBSTRATE, DISPLAY PANEL, DISPLAY APPARATUS, AND METHOD FOR MANUFACTURING ARRAY SUBSTRATE

(71) Applicant: Shanghai Tianma Micro-Electronics Co., Ltd., Shanghai (CN)

(72) Inventors: Junhui Lou, Shanghai (CN); Tianyi Wu, Shanghai (CN); Jujian Fu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/031,139

(22) Filed: Jul. 10, 2018

(65) Prior Publication Data

US 2019/0165004 A1    May 30, 2019

(30) Foreign Application Priority Data

Nov. 30, 2017   (CN) .......................... 2017 1 1241891

(51) Int. Cl.
| | |
|---|---|
| *H01L 27/12* | (2006.01) |
| *H01L 29/786* | (2006.01) |
| *H01L 29/66* | (2006.01) |
| *G09G 3/3225* | (2016.01) |
| *H01L 27/32* | (2006.01) |

(Continued)

(52) U.S. Cl.
CPC ....... *H01L 27/1251* (2013.01); *G09G 3/3225* (2013.01); *H01L 27/124* (2013.01); *H01L 27/127* (2013.01); *H01L 27/1225* (2013.01); *H01L 27/1262* (2013.01); *H01L 29/66969* (2013.01); *H01L 29/7869* (2013.01); *H01L 29/78696* (2013.01); *G02F 1/1368* (2013.01); *G02F 1/136286* (2013.01); *G02F 2001/136295* (2013.01); *G02F 2202/10* (2013.01); *H01L 27/3262* (2013.01); *H01L 27/3276* (2013.01);

(Continued)

(58) Field of Classification Search
CPC .......... H01L 29/78606; H01L 27/1225; H01L 27/1222; H01L 29/78696; H01L 27/1251; G09G 3/3696
See application file for complete search history.

(56) References Cited

U.S. PATENT DOCUMENTS

| | | | |
|---|---|---|---|
| 2015/0380563 A1* | 12/2015 | Park ................. | H01L 29/78606 257/43 |
| 2016/0020230 A1* | 1/2016 | Lee ..................... | H01L 27/127 257/43 |

* cited by examiner

*Primary Examiner* — Dung A. Le
(74) *Attorney, Agent, or Firm* — Tarolli, Sundheim, Covell & Tummino LLP

(57) ABSTRACT

An array substrate, display panel, display apparatus, and method for manufacturing the array substrate are provided. Array substrate includes pixel driving circuit and peripheral driving circuit. Array substrate further includes a plurality of thin film transistors including first type of thin film transistor electrically connected into peripheral driving circuit for outputting driving signal and second type of thin film transistor connected to peripheral driving circuit for outputting scanning signal. The thin film transistor includes an active layer of oxide semiconductor including at least one sub-layer. Compared with second type of thin film transistor, active layer of first type of thin film transistor has more sub-layers, and thickness of active layer of first type of thin film transistor is larger. Each sub-layer of the active layer of the second type of thin film transistor is in a same layer as the active layer of the first type of thin film transistor.

20 Claims, 11 Drawing Sheets

(51) Int. Cl.
  *G02F 1/1362* (2006.01)
  *G02F 1/1368* (2006.01)
  *H01L 51/52* (2006.01)
(52) U.S. Cl.
  CPC .... *H01L 51/5253* (2013.01); *H01L 2227/323* (2013.01)

ARRAY SUBSTRATE, DISPLAY PANEL, DISPLAY APPARATUS, AND METHOD FOR MANUFACTURING ARRAY SUBSTRATE

CROSS-REFERENCE TO RELATED APPLICATIONS

The present application claims priority to Chinese Patent Application No. 201711241891.X, filed on Nov. 30, 2017, the content of which is incorporated herein by reference in its entirety.

TECHNICAL FIELD

The present disclosure relates to the field of display technologies and, in particular, to an array substrate, a display panel including the display substrate, a display apparatus and a method for manufacturing the array substrate.

BACKGROUND

In the related art, plane displayers are classified as active matrix displayers and passive matrix displayers based on the driving manners. The difference between an active matrix displayer and a passive matrix displayer lies in that an active element is provided in the circuit structure of the active matrix displayer. Generally, the active element is a thin film transistor. The active matrix displayer controls, through the thin film transistor, the regions such as the pixel region of the displayer to work.

However, the various thin film transistors in the circuit structure have different functions and usages. For the thin film transistors that play different roles in the circuit structure, the requirements on the characteristics or the parameters of the thin film transistors are also different.

SUMMARY

The present disclosure provides an array substrate, a display panel including the display substrate, a display apparatus and a method for manufacturing the array substrate.

The present disclosure provides an array substrate, including a base-substrate and a plurality of circuit structures disposed on a side of the base-substrate. The plurality of circuit structures includes a pixel driving circuit located in a display region and a peripheral driving circuit surrounding the display region. The plurality of circuit structures includes a plurality of thin film transistors including a first type of thin film transistor and a second type of thin film transistor, and each of the plurality of thin film transistors includes a gate electrode, a gate insulation layer, an active layer of an oxide semiconductor including at least one sub-layer, and a source-drain electrode stacked in a direction perpendicular to the base-substrate. The active layer of the first type of thin film transistor has more sub-layers than that of the active layer of the second type of thin film transistor, a total thickness of the active layer of the first type of thin film transistor is larger than a total thickness of the active layer of the second type of thin film transistor, and each sub-layer of the active layer of the second type of thin film transistor is in a same layer as the active layer of the first type of thin film transistor. The first type of thin film transistor is electrically connected into the pixel driving circuit, and is configured to output a driving signal for controlling brightness of a display device. The second type of thin film transistor is electrically connected into the peripheral driving circuit, and is configured to output a scanning signal.

The present disclosure further provides a display panel including the array substrate.

The present disclosure further provides a display apparatus including the display panel.

The present disclosure further provides a method for manufacturing an array substrate, including a step of: forming, on a side of a base-substrate, a gate electrode, a gate insulation layer, an active layer of an oxide semiconductor and a source-drain electrode for a first type of thin film transistor and a second type of thin film transistor, respectively. The step of forming the active layer of the first type of thin film transistor and the second type of thin film transistor further includes steps of: forming a first active layer on the side of the base-substrate, and patterning the first active layer to form a part of the active layer of the first type of thin film transistor; and forming a second active layer on a side of the first active layer away from the base-substrate, and patterning the second active layer to form the active layer of the second type of thin film transistor and another part of the active layer of the first type of thin film transistor.

DESCRIPTION OF EMBODIMENTS

Figure 1:
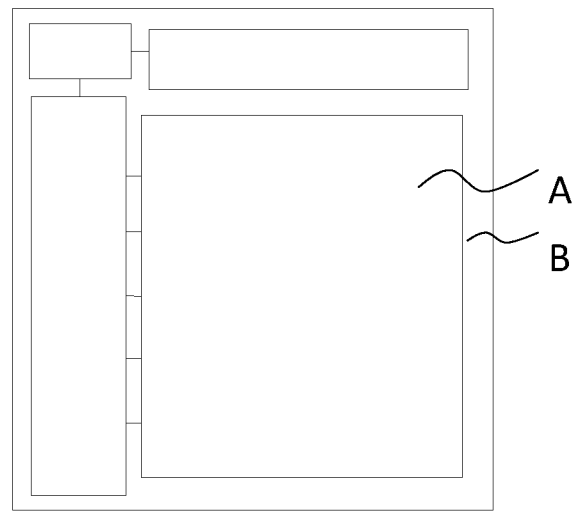
FIG. 1 is a structural schematic diagram of an array substrate in the related art.

In order to make the purposes, features and advantages of the present disclosure more understandable, the present disclosure will be further described with reference to the accompanying drawings and embodiments.

It should be noted that, specific details are provided in the following description so as to make the present disclosure more understandable. However, the present disclosure can be implemented in various other manners different from those described herein, and those skilled in the art may make similar promotions without departing from the scope of the present disclosure. Therefore, the present disclosure is not limited to the embodiments disclosed as follows.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, it is also possible that the element is formed "above" or "below" the other element via a middle element.

In order to make the purposes, features and advantages of the present disclosure more understandable, the present disclosure will be further described with reference to the accompanying drawings and embodiments. However, the embodiments may be implemented in many manners and should not be construed as limited to the embodiments provided herein. These embodiments are provided so that the present disclosure will be understandable, and will better convey the concepts of the embodiments to those skilled in the art. A same reference sign in the drawings represents a same or similar structure, and thus repetitive description thereof will be omitted. The expressions about the positions and directions in the present disclosure are all described by taking the drawings as examples, however, changes may be made if necessary, and all these changes should be included in the protection scope of the present disclosure. The drawings of the present disclosure are merely for illustrating a relative position relationship, and the layer thicknesses of some portions are exaggerated for the sake of comprehension, and the layer thicknesses in the drawings do not represent the proportional relationship of the actual layer thicknesses. The embodiments in the present disclosure and the features in the embodiments may be combined with each other. The drawings of the embodiments in the present disclosure use the same reference signs. In addition, the common feathers of the embodiments will not be repeated herein.

As shown in FIG. 1, FIG. 1 is a structural schematic diagram of an array substrate in the related art. The array substrate 10 may be used in a display panel. The array substrate 10 includes a plurality of circuit structures, which includes a plurality of thin film transistors. The array substrate 10 is divided into a display region A and a non-display region B surrounding the display region A. The plurality of circuit structures of the array substrate 10 includes a pixel driving circuit disposed in the display region A and a peripheral driving circuit disposed in the non-display region B.

The inventor found that, since the thin film transistors at different positions in the circuit structure have different functions and usages, during the working of the circuit, the signals responded or transmitted by the thin film transistors at different positions in the circuit structure are different. In order to enable the thin film transistor to accurately and effectively respond to or transmit the corresponding signal, the requirements on the characteristics or the parameters of the thin film transistors at different positions in the circuit structure are also different.

Figure 2:
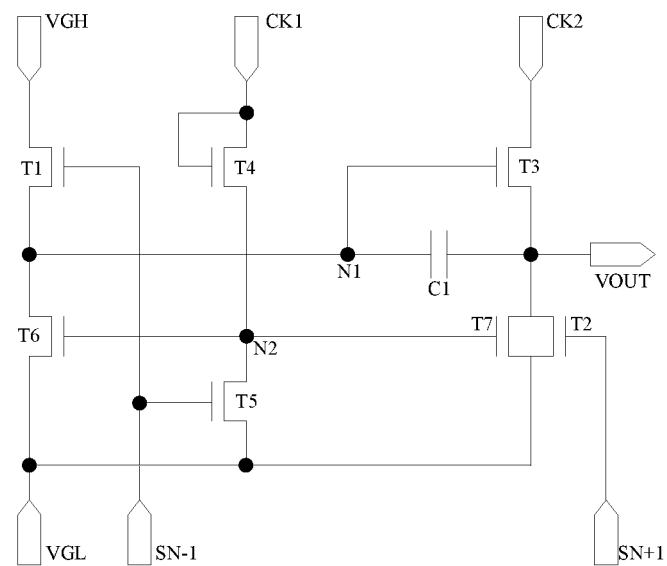
FIG. 2 is a structural schematic diagram of a shift register circuit in the related art.

For example, in the related art, the peripheral driving circuit includes a shift register circuit. The register circuit usually includes a plurality of transistors and needs more clock signals for driving. As shown in FIG. 2, FIG. 2 is a structural schematic diagram of a shift register circuit in the related art. This shift register circuit includes seven transistors (a first transistor T1 to a seventh transistor T7) and a first capacitor C1. The seven transistors T1-T7 are N-type transistors. The third transistor T3 is configured to transmit a second clock signal CK2 to a signal output VOUT in response to a signal of a first node N1, so that the shift register circuit outputs a scan driving signal.

If a threshold voltage of the third transistor T3 is excessively small, for example, Vth<0, the third transistor T3 cannot be completely turned off. During a certain period, the fourth transistor T4 needs to be turned off, and a low voltage (for example, −10V) is applied to a gate electrode of the third transistor T3. At this time, a source voltage of the third transistor T3 is also a low voltage of −10V, and the second clock signal CK2 inputs a low level of −10V during this period. Then the gate-source voltage of the third transistor T3 is Vgs=0V>Vth, the third transistor T3 cannot be normally turned off, and the second clock signal CK2 leaks from the third transistor T3 to the signal output VOUT, so that scan driving signal output by the shift register circuit turns into a multi-pulse signal, resulting in abnormal display.

In the related art, the pixel driving circuits are generally located in the display region and one-to-one correspond to the pixel units, for controlling the pixel to emit light. The pixel driving circuit generally includes a switching transistor and a driving transistor, the driving transistor is configured to output a driving signal for controlling brightness of the display device, for example, in a liquid crystal display panel, the driving transistor is configured to transmit a driving signal to the pixel electrode in response to the scanning signal, or for example, in an organic light-emitting display panel, the driving transistor is configured to control the light emitting, brightness and grayscale of the light-emitting transistor. If the threshold voltage of such a driving transistor is changed with the increase of the driving time, the control of the brightness of the corresponding pixel cannot be achieved at a desired level. Therefore, the threshold voltage of such a thin film transistor for driving the pixels needs to have a high stability.

As a type of the thin film transistor, the oxide semiconductor thin film transistor gets more and more attention because of its large migration rate, small off-state current and low manufacturing cost. In the inventor's study on the oxide semiconductor thin film transistor, it is found that for the oxide semiconductor thin film transistor, properly reducing the thickness of the oxide semiconductor layer (i.e., the active layer of the oxide semiconductor thin film transistor) may effectively improve the threshold voltage of the oxide semiconductor thin film transistor.

Figure 3:
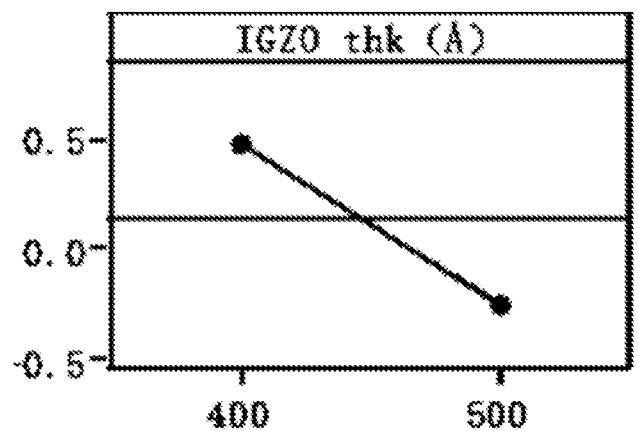
FIG. 3 is a simulation diagram of relation between a threshold voltage of an oxide semiconductor thin film transistor and a thickness of an oxide semiconductor layer according to an embodiment of the present disclosure.

The inventors found from experiments that, as shown in FIG. 3, FIG. 3 is a simulation diagram of the relation between a threshold voltage of an oxide semiconductor thin film transistor and a thickness of an oxide semiconductor layer. The oxide semiconductor is indium gallium zinc oxide (IGZO), the abscissa represents the thickness (unit: A) of the oxide semiconductor layer, and the ordinate represents the threshold voltage Vth (unit: V). It can be seen from FIG. 3 that, as the thickness of the oxide semiconductor layer keeps decreasing, while the threshold voltage Vth of the thin film transistor keeps increasing.

With further experiments, it was found that, as the thickness of the oxide semiconductor layer keeps decreasing, the threshold voltage stability (especially the positive bias stability) of the oxide semiconductor thin film transistor is significantly decreased while the threshold voltage Vth is increased, and thus the displayer (especially the organic light emitter) has additional abnormal display (such as image sticking and Mura) caused by the drifting of the threshold voltage Vth.

Figure 4:
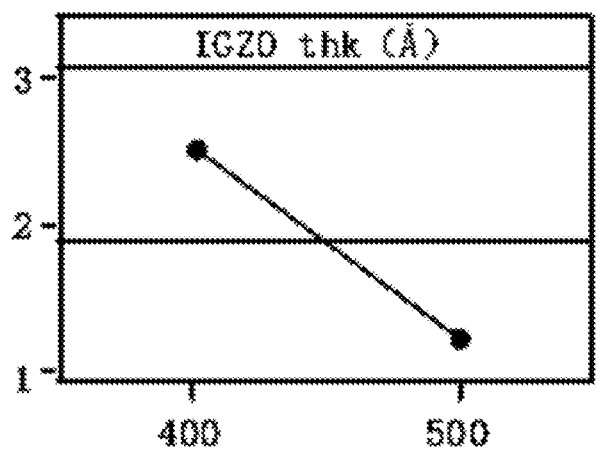
FIG. 4 is a simulation diagram of relation between threshold voltage stability of an oxide semiconductor thin film transistor and a thickness of an oxide semiconductor layer according to an embodiment of the present disclosure.

As shown in FIG. 4, FIG. 4 is a simulation diagram of the relationship between threshold voltage stability of an oxide semiconductor thin film transistor and a thickness of an oxide semiconductor layer. The oxide semiconductor is indium gallium zinc oxide (IGZO), the abscissa represents the thickness (unit: Å) of the oxide semiconductor layer, and the ordinate represents the variation amount $\Delta Vth$ (unit: V) of the threshold voltage. It can be seen from FIG. 4 that, as the thickness of the oxide semiconductor layer keeps decreasing, the variation amount $\Delta Vth$ of the threshold voltage of the thin film transistor keeps increasing, that is, as the thickness of the oxide semiconductor layer keeps decreasing, the stability of the threshold voltage of the thin film transistor keeps decreasing.

In view of this, the present disclosure provides an array substrate, including: a substrate, and a plurality of circuit structures disposed on one side of the substrate. The plurality of circuit structures includes a pixel driving circuit in a display region and a peripheral driving circuit surrounding the display region. The plurality of circuit structures includes a plurality of thin film transistors. Each thin film transistor includes a gate electrode, a gate insulation layer, an active layer of an oxide semiconductor including at least one sub-layer, and a source-drain electrode, which are stacked along a direction perpendicular to the substrate.

Figure 5:
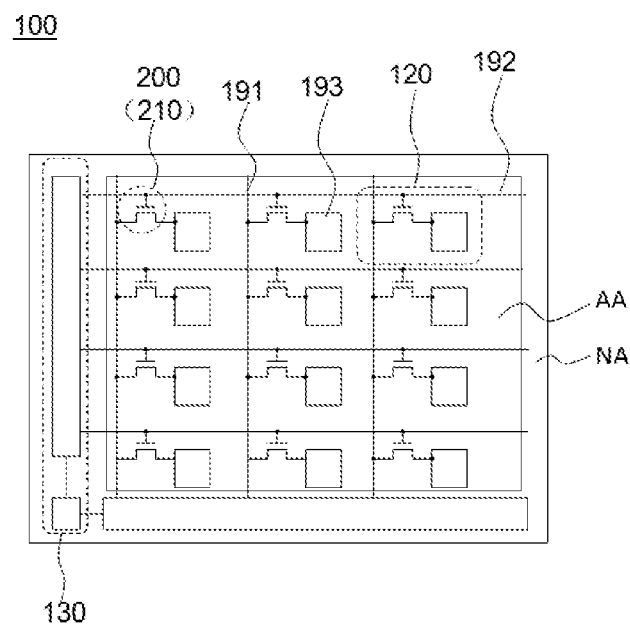
FIG. 5 is a top view of an array substrate according to an embodiment of the present disclosure.
Figure 6:
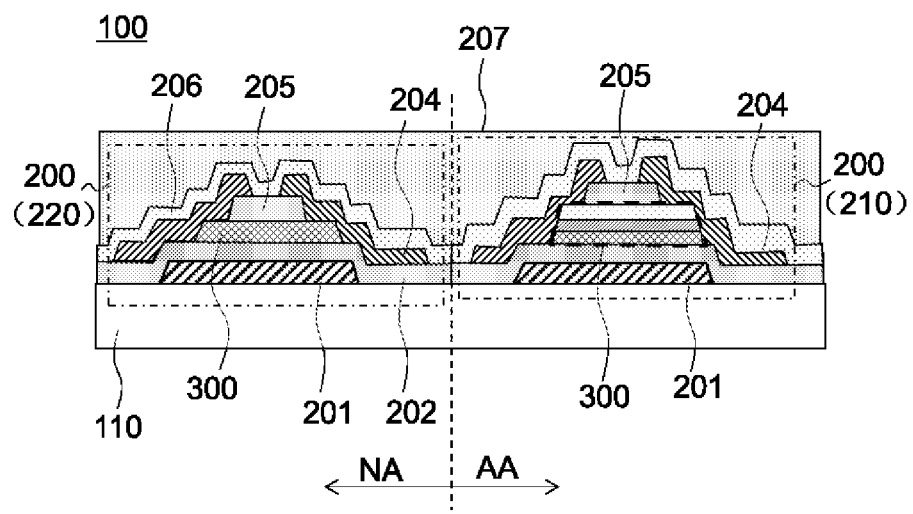
FIG. 6 is a cross-sectional view of an array substrate according to an embodiment of the present disclosure.

As shown in FIG. 5 and FIG. 6, wherein FIG. 5 is a top view of an array substrate according to an embodiment of the present disclosure, FIG. 6 is a cross-sectional view of an array substrate according to an embodiment of the present disclosure, and the cross-section direction is perpendicular to the array substrate. The array substrate 100 may be used for a liquid crystal display panel and may also be used for an organic light-emitting display panel. The display panel including the array substrate will be further described in the following, which will not be repeated herein.

The array substrate 100 includes a base-substrate 110 that may be formed by material such as glass, polyimide (PI), polycarbonate (PC), polyethersulfone (PES), polyethylene terephthalate (PET), polyethylene naphthalate (PEN), polyarylate (PAR), or glass fiber reinforced plastic (FRP). The base-substrate 110 may be transparent, semitransparent or opaque.

The base-substrate in the embodiments of the present disclosure may also be a flexible base-substrate formed by a thinner polymer (such as polyimide). The base-substrate may include a buffer layer that may include a multilayer stack structure formed by multiple inorganic, organic layers, so as to block oxygen and moisture and thus prevent moisture or impurity from diffusing via the substrate, and a planar surface is provided for an upper surface of the base-substrate, which is beneficial to manufacturing a subsequent layer, and the specific structure thereof will not be repeated herein.

The array substrate 100 further includes a plurality of circuit structures disposed on one side of the base-substrate 110. The array substrate 100 is divided into a display region AA and a peripheral region NA surrounding the display region AA. The plurality of circuit structures includes a pixel driving circuit 120 (surrounded by a dashed line frame in FIG. 5, wherein some elements of the pixel driving circuit are not shown in the figure) disposed in the display region AA, and a peripheral driving circuit 130 (surrounded by a dashed line frame in FIG. 5) surrounding the display region AA. It should be understood that, the array substrate is used to provide a driving signal to the display panel and control the display of the display panel. The display panel includes a normal display screen region and a peripheral region surrounding the display screen region. In the present disclosure, the display region of the array substrate belongs to the normal display screen region of the display panel, and the peripheral region surrounding the display region belongs to the peripheral region of the display panel.

The plurality of circuit structures includes a plurality of thin film transistors (TFT). An embodiment of the present disclosure is described by taking a bottom-gate type of thin film transistor as an example. In other optional embodiments of the present disclosure, the thin film transistor may be a top-gate structure.

The thin film transistor 200 (surrounded by a dot-dash line frame in FIG. 6) includes a gate electrode 201, a gate insulation layer 202, an active layer 300 and a source-drain electrode 204 which are sequentially stacked along a direction away from the base-substrate 110. The active layer 300 is a layer of oxide semiconductor active layer including at least one sub-layer, and the active layer 300 has a drain contact region and a source contact region formed by doping N-type impurity ions, and a channel region formed between the drain contact region and the source contact region. The source-drain electrode 204 includes a source electrode and a drain electrode spaced from each other. The array substrate 100 further includes an etch barrier layer 205 disposed between the active layer 300 and the source-drain electrode 204. The etch barrier layer 205 exposes the source contact region and the drain contact region of the active layer 300; the source electrode and the drain electrode respectively contact with the source contact region and the drain contact region of the active layer 300.

Optionally, the oxide semiconductor active layer in the thin film transistor may be any one of IGZO, ITZO, IGZTO, IGO and IAZO, or any combination thereof.

The array substrate 100 further includes a passivation layer 206 and a planarization layer 207. The passivation layer 206 is disposed on the thin film transistor 200, specifically, disposed on the source-drain electrode 204. The passivation layer may be formed by an inorganic layer such as silicon oxide or silicon nitride or may be formed by an organic layer. The planarization layer 207 is disposed on the passivation layer 206, and may include an organic layer such as acrylic, polyimide (PI) or benzocyclobutene (BCB). The planarization layer 270 has a planarization function.

The plurality of thin film transistors 200 includes a first type of thin film transistor 210 and a second type of thin film transistor 220. The first type of thin film transistor 210 has an active layer 300 (surrounded by bold dashed lines in FIG. 6) having more sub-layers than that of the second type of thin film transistor. A total thickness of the active layer 300 of the first type of thin film transistor 220 is larger than a total thickness of the active layer 300 of the second type of thin film transistor 220. And each sub-layer of the active layer 300 of the second type of thin film transistor 220 is in a same layer as the active layer 300 of the first type of thin film transistor 210.

That is, each sub-layer of the active layer of the second type of thin film transistor is in a same layer as one sub-layer of the active layer of the first type of thin film. The active layer of the first type of thin film transistor includes at least one more sub-layer, except for the sub-layer(s) being in the same layer as the active layer of the second type of thin film transistor.

The first type of thin film transistor 210 is electrically connected into the pixel driving circuit 120 for outputting a driving signal for controlling brightness of the display device.

The second type of thin film transistor 220 is electrically connected into the peripheral driving circuit for outputting a scanning signal.

Since the total thickness of the active layer of the first type of thin film transistor is larger than the total thickness of the active layer of the second type of thin film transistor, the first type of thin film transistor has a relatively high threshold voltage stability and is suitable for outputting a driving signal to control brightness of the display device, and may offer a signal for the device needing an accurate signal, and offer accuracy of the circuit signal. Since the second type of thin film transistor has an active layer with a relatively small thickness, it has a relatively high threshold voltage, it can precisely respond to the switching control of the signal, and precisely respond to the control signal, and can precisely output a scanning signal numerically and timely. With different designs and different applications of the first type of thin film transistor and the second type of thin film transistor, the working reliability of the circuit structure in the array substrate can be effectively improved.

In addition, with the array substrate provided in the embodiments of the present disclosure, the thin film transistors in different regions (such as the peripheral driving circuit and the pixel driving region) may have different characteristics, so as to satisfy different requirements of the circuits in different regions on characteristics of the thin film transistor devices, so that both the requirement for high threshold voltage stability in some positions and the requirement for high threshold voltage in some positions can be satisfied, and thus the thin film transistors in different positions in the circuit can work better with the circuit to better perform the functions and play the roles, so that a signal output from the circuit in the array substrate during working is more accurate and reliable. Moreover, with the array substrate provided in the embodiments of the present disclosure, thin film transistors satisfying different requirements do not need to be manufactured in batches while the circuit reliability is improved, without increasing the process window or increasing the layer thickness.

Optionally, the gate electrode of the first type of thin film transistor is in the same layer as the gate electrode of the second type of thin film transistor; the gate insulation layer of the first type of thin film transistor is in the same layer as the gate insulation layer of the second type of thin film transistor; the source-drain electrode of the first type of thin film transistor is in the same layer as the source-drain electrode of the second type of thin film transistor. In this way, the thin film transistors satisfying the requirements for different characteristics can be simultaneously completed on a same base-substrate, the process is simplified while the circuit reliability is improved, without increasing the process window or increasing the layer thickness.

Further, the first type of thin film transistor 210 is directly electrically connected to the display device in the pixel driving circuit. It should be understood that, the display device may be a light-emitting element in the display panel, for example, a pixel electrode in a liquid crystal display panel or an organic light-emitting diode in an organic light-emitting display panel. The first type of thin film transistor is equivalent to a driving transistor and is directly connected to the display device so as to control light emitting and brightness grayscale of the display device. For details, please refer to FIG. 5 and FIG. 7.

With reference to FIG. 5, the array substrate 100 may be used for a liquid crystal display panel. The array substrate 100 further includes a plurality of first signal lines 191 (i.e., data lines) and a plurality of second signal lines 192 (i.e., scanning lines) intersecting with each other and insulated from each other, which together define a plurality of pixel units arranged in a matrix. The first type of thin film transistor 210 is connected between the first signal line 191 and the pixel electrode 193 through its source electrode and drain electrode. The first signal line 191 is for transmitting a driving signal. The gate electrode of the first type of thin film transistor 210 is connected to the second signal line 192. The second signal line 192 is used for transmitting a scanning signal to the first type of thin film transistor 210, controlling the switching state of the first type of thin film transistor 210, thereby controlling whether the first type of the thin film transistor 210 can transmit a driving signal (i.e., pixel voltage) to the pixel electrode 193.

Figure 7:
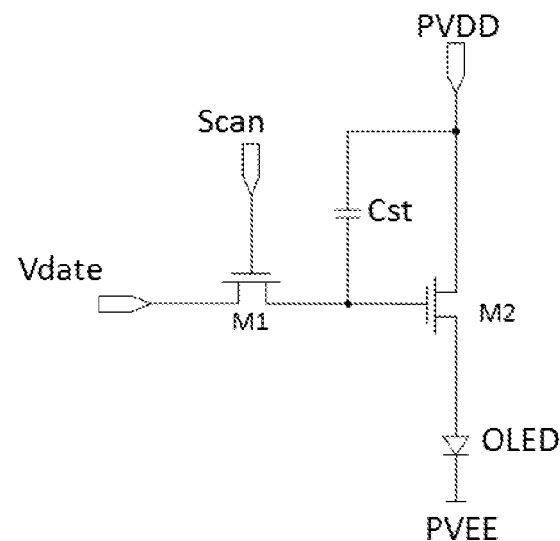
FIG. 7 is a schematic diagram of a pixel driving circuit of another array substrate according to an embodiment of the present disclosure.

As shown in FIG. 7, FIG. 7 is a schematic diagram of a pixel driving circuit of another array substrate according to an embodiment of the present disclosure. The array substrate 100 may be used for a liquid crystal display panel. The array substrate 100 further includes a switching thin film transistor M1, a driving thin film transistor M2, and a storage capacitor Cst. The driving thin film transistor M2 is connected between an organic light-emitting diode OLED and a voltage source through its source electrode and drain electrode, for providing a driving current to the light-emitting diode OLED on the basis of a voltage provided by the voltage source PVDD; the gate electrode of the driving thin film transistor M2 is configured to be turned on or turned off in response to a signal provided by the source electrode and drain electrode of the driving thin film transistor M2. During the light emitting stage of the light-emitting diode OLED, when the scanning line scans a certain row, a voltage is applied to the gate electrode of the switching thin film transistor M1 by this row of scanning line, the switching thin film transistor is turned on, the signal line transmits a data signal, and a voltage is applied to the gate electrode of the driving thin film transistor M2 via the switching thin film transistor M1 and drives the driving thin film transistor M2 to be turned on, the power line applies a constant voltage, a current flows through the light-emitting diode OLED and makes the light-emitting diode OLED to emit light, and thus making the pixel to be in a light emitting state; the storage capacitor Cst is charged by the voltage provided by the signal line, and the signal is stored in the storage capacitor Cst.

It should be understood that, the pixel driving circuits one-to-one correspond to the pixels in the display panel, brightness grayscale of each pixel is controlled, and each pixel driving circuit includes a driving transistor. The working state of the thin film transistor has a great relation with its threshold voltage. That is, the signal transmitted by the driving transistor for controlling light emitting and brightness of the display device is not only controlled by a data signal and a scanning signal but also controlled by the threshold voltage of the driving transistor itself. If a deviation happens to the threshold voltage changing with time, the display panel will suffer uneven brightness, color cast and other abnormalities, influencing the display effect. With the array substrate provided in the above embodiments of the present disclosure, the first type of thin film transistor with high threshold voltage stability is used as the driving transistor connected to the display device, so as to make the driving transistor to have a high stability in a long-term operation, and to avoid abnormal light emitting and brightness grayscale of the display device, thereby improving the display effect and service life of the display panel.

Further, the second type of thin film transistor 220 is directly electrically connected to an output of the peripheral driving circuit. As shown in FIG. 2, the third transistor T3 is configured as a second type of thin film transistor, for transmitting the second clock signal CK2 to the signal output VOUT in response to a signal of the first node N1. That is, the source electrode of the second type of thin film transistor 220 is the output of the peripheral drive circuit (shift register). Since the second type of thin film transistor 220 has a higher threshold voltage, the third transistor T3 can be completely turned off during a non-scanning state, i.e., during a state in which the signal output VOUT does not output a scanning signal and the third transistor T3 needs to be turned off, and thus abnormal display caused by signal leakage can then be avoided.

Figure 8:
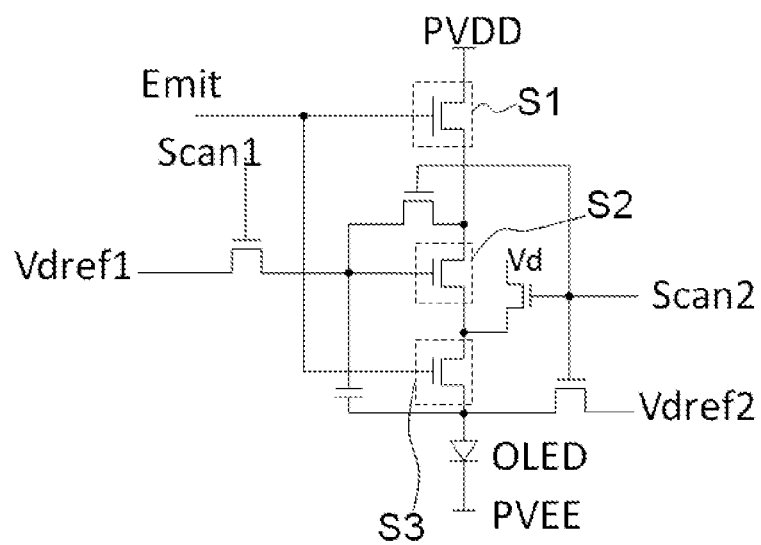
FIG. 8 is a schematic diagram of a pixel driving circuit of another array substrate according to an embodiment of the present disclosure.
Figure 9:
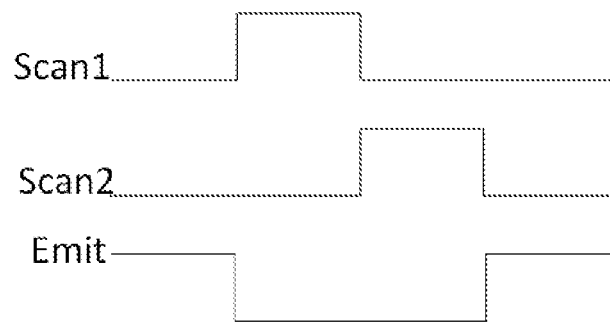
FIG. 9 is a schematic diagram of driving timing and waveform of the pixel driving circuit in FIG. 8.

It should be understood that, in other embodiments of the present disclosure, the positions at which the thin film transistor is connected in the circuit structure further includes a first position. During the working of the circuit structure, the thin film transistor at the first position is in a positive bias state for longer time than in a negative bias state. The thin film transistor at the first position is the first type of thin film transistor. That is, not only a position connected to the display device and a position of a driving signal for outputting brightness of the display device are provided with the first type of thin film transistor, if the first position exists at a position where the thin film transistor is connected in the circuit structure, and the thin film transistor at the first position is in a positive bias state for longer time than in a negative bias state, the thin film transistor at the first position is the first type of thin film transistor. Since the thin film transistor at the first position is in a positive bias state for a long time, the threshold voltage of the thin film transistor may deviate as the positive bias time gets longer. By setting the thin film transistor connected at the first position to be the first type of thin film transistor, the positive bias stability of the thin film transistor connected at this position is improved and the deviation of the threshold voltage is eliminated or alleviated, so that the problems of uneven brightness and color cast on the display screen can be avoided, thereby improving the display effect and the service life of the display panel. Optionally, as shown in FIG. 8 and FIG. 9, wherein FIG. 8 is a schematic diagram of a pixel driving circuit of another array substrate according to an embodiment of the present disclosure; FIG. 9 is a schematic diagram of driving timing and waveform of the pixel driving circuit in FIG. 8. Since the thin film transistor connected at the first position S2 needs to accurately control the signal provided to the next device and the signal for controlling the brightness grayscale of the organic light-emitting diode OLED, the thin film transistor connected at the first position S2 is the first type of thin film transistor.

Figure 10:
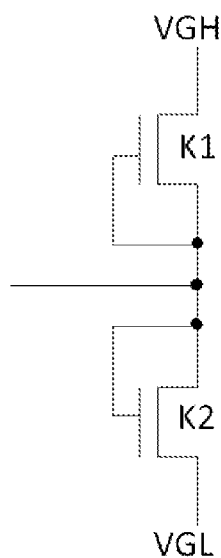
FIG. 10 is a schematic diagram of a circuit of another array substrate according to an embodiment of the present disclosure.

In other embodiments of the present disclosure, the positions at which the thin film transistor is connected in the circuit structure further include a second position. The thin film transistor at the second position has a voltage difference between the gate electrode and the source electrode, and during the working of the circuit structure, the voltage difference has longer time being zero than being positive, the thin film transistor connected at the second position is the second type of thin film transistor. For example, for an N-type thin film transistor, since the voltage difference between the gate electrode and the source electrode of the second thin film transistor has longer time being zero than being positive, when the thin film transistor at the second position needs to be turned off, the voltage difference between the gate electrode and the source electrode will be zero for a long time, that is, the voltage difference between the gate electrode and the source electrode is very small. In this case, the thin film transistor at the second position cannot be turned off if the threshold voltage is negative, the circuit cannot work normally. By setting the thin film transistor at the second position to be as the second type of thin film transistor, the threshold voltage of the thin film transistor at the second position is increased, so that the thin film transistor at the second position can be completely turned off, thereby improving the reliability of the circuit element and avoiding abnormal display caused by signal leakage. Optionally, as shown in FIG. 10, FIG. 10 is a schematic diagram of a circuit of another array substrate according to an embodiment of the present disclosure. FIG. 10 shows an electrostatic protection circuit, i.e., an ESD circuit. The second position is where the thin film transistor in the ESD protection circuit is located. In order to make the thin film transistor at the second position to be completely turned off so as to prevent the circuit from leaking electricity when the circuit does not need to release static electricity, the thin film transistor at the second position, i.e., the thin film transistor in the electrostatic protection circuit is set to be the second type of thin film transistor, thereby improving the circuit reliability.

In other embodiments of the present disclosure, the positions at which the thin film transistor is connected in the circuit structure further include a third position. During the working of the circuit structure, thin film transistor at the third position is used to provide a signal to a device that needs to respond to a precise signal. The thin film transistor connected at the third position is the first type of thin film transistor. Since the signal output by the thin film transistor is influenced not only by the response signal and the received signal but also by the threshold voltage of the thin film transistor itself. The change of the threshold voltage has a negative impact on accurately outputting a signal by the thin film transistor and keeping normal working of the circuit. Thus, by setting the thin film transistor for providing a signal to a device that needs to respond to a precise signal to be as the first type of thin film transistor, the threshold voltage stability of the thin film transistor is improved, so that the interference to the output signal from the change of the threshold voltage itself is avoided, and thus the accuracy of the signal output by the thin film transistor is improved. Optionally, as shown in FIG. 8 and FIG. 9, the thin film transistors connected at the third position S1 and S3 are used for responding to the Emit signal, and the Emit signal is in a high level for a long time, that is, the thin film transistors connected at the third positions S1 and S3 are in a positive bias state for a long time, and therefore the thin film transistors connected at the third positions S1 and S3 are the first type of thin film transistors. Thus, the above-mentioned problems can be solved and the circuit reliability can be improved. It should be noted that, the embodiments are not limited to the third position described in the above-mentioned circuit. For example, the fourth transistor T4 in FIG. 2 may also be set as the first type of thin film transistor. Since the fourth transistor T4 in FIG. 2 is used for responding to the first clock signal CK1 and is in the positive bias state for a half of the total time, it also belongs to the third position situation, the fourth transistor T4 needs to be set as the first type of thin film transistor so as to improve the reliability of the circuit.

Figure 11:
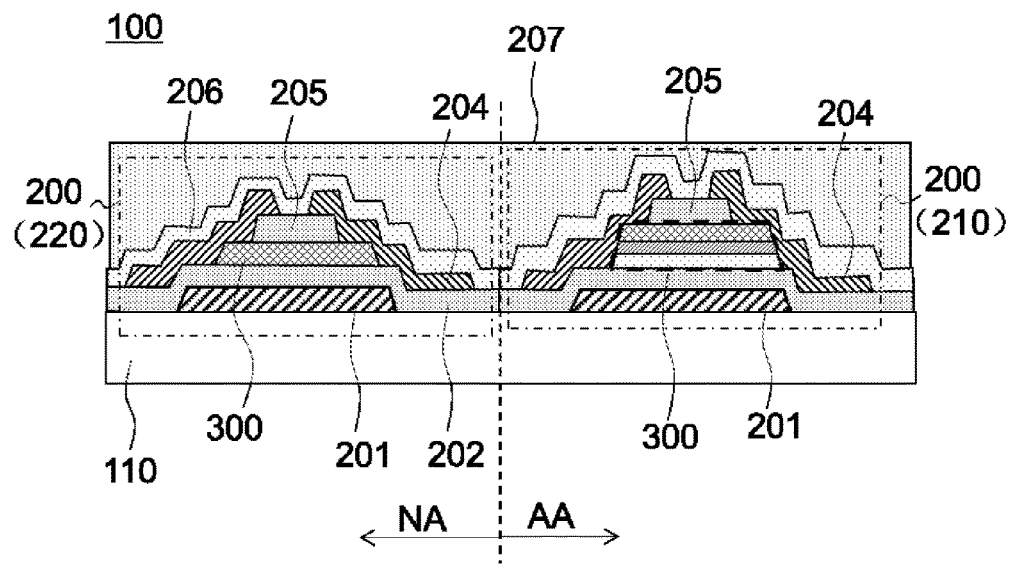
FIG. 11 is a cross-sectional view of another array substrate according to an embodiment of the present disclosure.

In another array substrate provided by the embodiments of the present disclosure, as shown in FIG. 11, FIG. 11 is a cross-sectional view of another array substrate according to an embodiment of the present disclosure. The active layer of the first type of thin film transistor 210 is divided into two parts, i.e., a first part (the part filled with grid pattern in FIG. 11) and a second part. The first part is in the same layer as the active layer of the second type of thin film transistor 220, and the second part is in different layers from the active layer of the second type of thin film transistor 220. The first part is located on a side of the second part facing away from the base-substrate 110.

The active layer of the first type of thin film transistor includes at least one more active sub-layer, except for the sub-layer(s) being in the same layer as the active layer of the second type of thin film transistor. Therefore, when manufacturing, it should be avoided that a part of the active layer of the first type of thin film transistor being different layers from the active layer of the second type of thin film transistor interferes with the other part of the active layer of the first type of thin film transistor being in the same layer as the active layer of the second type of thin film transistor. If a part of the active layer of the first type of thin film transistor being in a same layer as that in the second type of thin film transistor is located on a side of the other part of the active layer of the first type of thin film transistor being in different layers from that in the second type of thin film transistor facing toward the base-substrate, when manufacturing, the part of the active layer in the same layer will be first formed, and then a layer of oxide semiconductor layer is formed on it, and then the other part of the active layer of the first type of thin film transistor being in different layers from the active layer of the second type of thin film transistor is patterned. However, during the patterning etching process, the active layer of the second type of thin film transistor may be over-etched to cause defection. With the embodiments, the over-etching of the active layer of the second type of thin film transistor is avoided, and the process yield is maintained.

Figure 12:
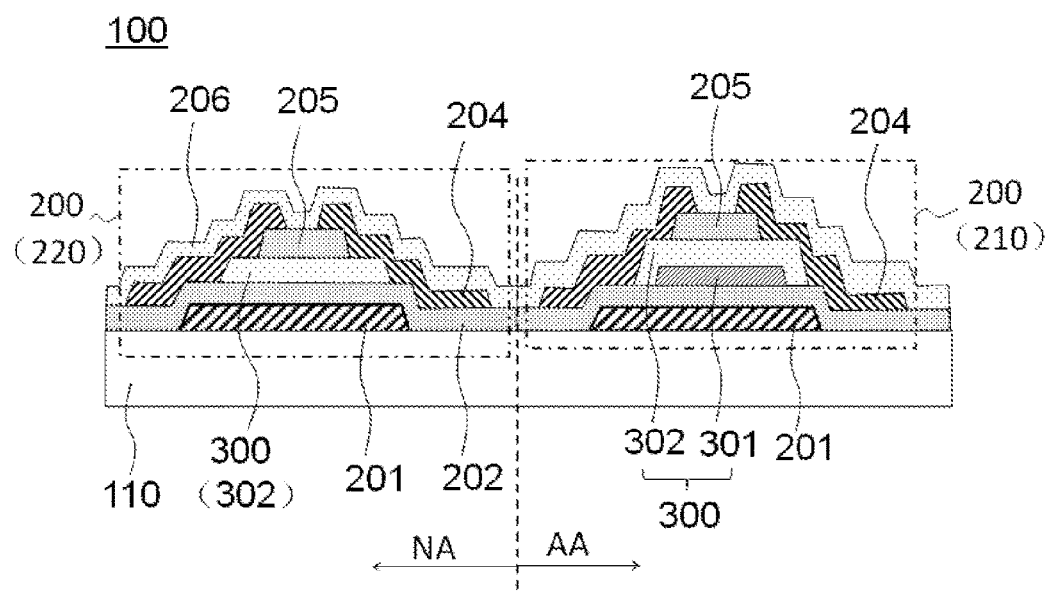
FIG. 12 is a cross-sectional view of another array substrate according to an embodiment of the present disclosure.

In another array substrate provided by the embodiments of the present disclosure, as shown in FIG. 12, FIG. 12 is a cross-sectional view of another array substrate according to an embodiment of the present disclosure. The array substrate 100 includes a first active layer 301 and a second active layer 302 that are stacked in a direction perpendicular to the base-substrate 110. The active layer 300 of the first type of thin film transistor 210 is a double-layer structure and is in a same layer as both the first active layer 301 and the second active layer 302, respectively; the active layer 300 of the second type of thin film transistor 220 is a single-layer structure and is only in a same layer as the second active layer 302. By setting the active layer as including at most two sub-layers, it may avoid excessive film layers from affecting formation of other layers to increase the process difficulty, thereby avoiding increasing the thickness of the array substrate, further, it may adjust the characteristics of the thin film transistor by the layer number difference. That is, on the basis of that each thin film transistor has an active layer of oxide semiconductor in the same layer, only one additional active layer of oxide semiconductor needs to be provided to meet the requirements of different thin film transistors for the active layer thickness.

In an embodiment, in the first type of thin film transistor 210, an orthogonal projection of the second active layer 302 on the base-substrate 110 covers an orthographic projection of the first active layer 301 on the base-substrate 110. The first active layer 301 is covered by the second active layer 302 so that the source-drain electrode 204 in the first type of thin film transistor 210 can only be in contact with the second active layer 302, which is consistent with the situation in which the source-drain electrode 204 in the second type of thin film transistor 220 is in contact with the active layer 300. In this way, the contact property of the active layer of each thin film transistor with the source-drain electrode can be consistent.

In an embodiment, the thickness of the first active layer is less than the thickness of the second active layer. In order to make the thin film transistor work normally, the thickness of the active layer of the oxide semiconductor thin film transistor has a certain range, and the thickness should not be excessively large. Making the thickness of the first active layer smaller than the thickness of the second active layer can prevent the thickness of the active layer of the first type of thin film transistor from exceeding the required thickness range for normal working of the device. Moreover, by making the thickness of the first active layer smaller than the thickness of the second active layer, it may be avoided that the characteristic difference between the two types of thin film transistors is excessively large, and it may further be avoided that the thickness difference between devices in the circuit structure is too large, so that other characteristics of the thin film transistor or the circuit structure will not be influenced, and it is beneficial to the uniformity of the overall film layer structure of the array substrate.

Optionally, the thickness of the second active layer ranges from 300 Å to 500 Å. It can be seen from the experiments in FIG. 3 and FIG. 4 that, in this way, the threshold voltage of the second type of thin film transistor is not excessively small.

Further, the thickness of the second active layer ranges from 300 Å to 450 Å. That is, the thickness of the second active layer is not smaller than 300 Å, so that the thickness of the active layer of the second type of thin film transistor will not be too thin to cause device failure and makes a contribution to the thickness of the active layer of the first type of thin film transistor. Experimental data shows that, if the thickness of the second active layer is not larger than 450 Å, and the effect of improving the threshold voltage of the second type of thin film transistor is better, which is more beneficial to avoiding the situation that the second type of thin film transistor cannot be turned off normally.

Further, the thickness of the second active layer is 400 Å. This is beneficial for the second type of thin film transistor to satisfy the requirement of increasing the threshold voltage, and more beneficial to matching and combination of the thickness of the second active layer with the thickness of the first active layer of the first type of thin film transistor. Moreover, it can be seen from the data in FIG. 3 and FIG. 4 that, the thickness of the oxide semiconductor active layer is 400 Å, and the preset voltage of the thin film transistor is already positive and sufficient to satisfy the characteristics of the thin film transistor required by the position of the second type of thin film transistor. When the thickness of the active layer is 400 Å, the threshold voltage stability of the thin film transistor is not high, no more additional or thicker oxide semiconductor layers need to be provided.

Optionally, the thickness of the first active layer ranges from 50 Å to 200 Å. In this way, it may be avoided that the characteristic difference between the first type of thin film transistor and the second type of thin film transistor is excessively large, and it may further be avoided that the thickness difference between devices in the circuit structure is too large, so that other characteristics of the thin film transistor or the circuit structure will not be influenced, and it is beneficial to the uniformity of the overall film layer structure of the array substrate. When the second active layer has a thickness of 400 Å, the thickness of the active layer of the first type of thin film transistor is in a range from 450 Å to 600 Å. That is, the threshold voltage deviation of the first type of thin film transistor is not larger than 2V. Optionally, when the thickness of the first active layer is 100 Å, the thickness of the active layer of the first type of thin film transistor 500 Å, the threshold voltage deviation of the first type of thin film transistor is approximately 1V. It can be seen from the above analysis that, when the thicknesses of the first active layer and the thickness of the second active layer respectively adopt the above-mentioned thickness range or thickness value, the threshold voltage of the second type of thin film transistor may be increased and the threshold voltage stability of the first type of thin film transistor may be increased, meanwhile, the structure of each thin film transistor may be manufactured more easily, and other characteristics of the thin film transistor may be more stable.

In other embodiments of the present disclosure, the difference between the thickness of the active layer of the first type of thin film transistor and the thickness of the active layer of the second type of thin film transistor is in a range from 10 Å to 500 Å. In this way, it may be avoided that the characteristic difference between the first type of thin film transistor and the second type of thin film transistor is excessively large, and it may further be avoided that the thickness difference between devices in the circuit structure is too large, so that other characteristics of the thin film transistor or the circuit structure will not be influenced, and it is beneficial to the uniformity of the overall film layer structure of the array substrate.

Figure 13:
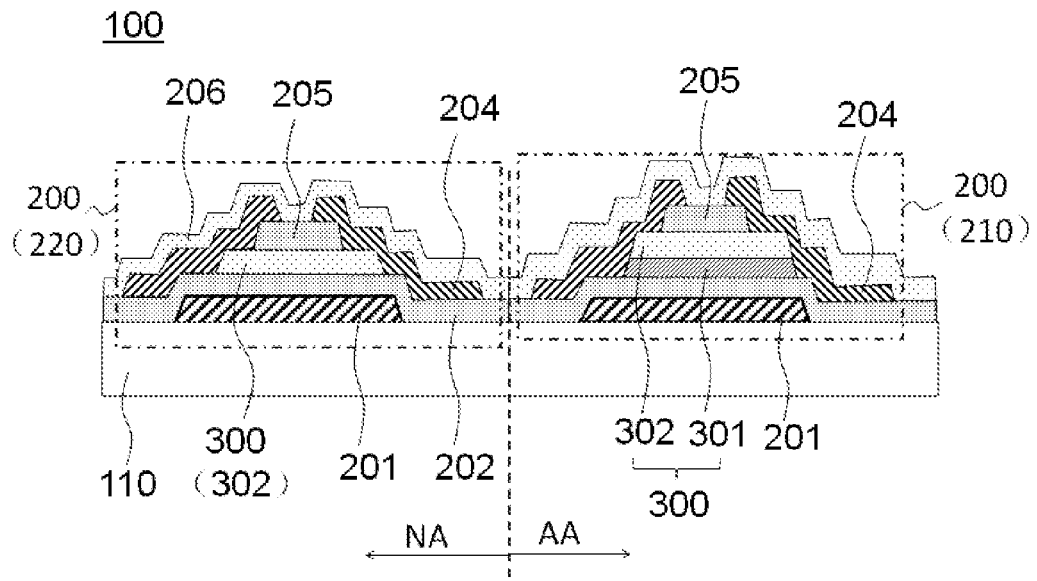
FIG. 13 is a cross-sectional view of another array substrate according to an embodiment of the present disclosure.
Figure 14:
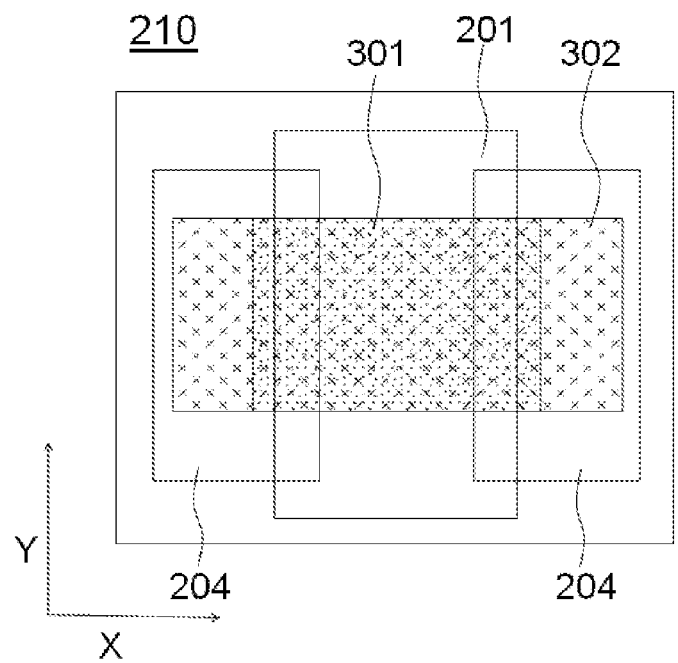
FIG. 14 is a top view of a first type of thin film transistor in another array substrate according to an embodiment of the present disclosure.

In another array substrate provided by the embodiment of the present disclosure, as shown in FIG. 13 and FIG. 14, wherein FIG. 13 is a cross-sectional view of another array substrate according to an embodiment of the present disclosure; FIG. 14 is a top view of a first type of thin film transistor in another array substrate according to an embodiment of the present disclosure. For illustration purposes, the layers of the first type of thin film transistor are shown in a perspective view.

The array substrate 100 further includes a first active layer 301 and a second active layer 302 that are stacked in a direction perpendicular to the base-substrate 110. The active layer 300 of the first type of thin film transistor 210 is a double-layer structure and is in a same layer as the first active layer 301 and the second active layer 302, respectively; the active layer 300 of the second type of thin film transistor 220 is a single-layer structure and is only in a same layer as the second active layer 302.

Optionally, the active layer 300 of the first type of thin film transistor 210 includes a channel region and source-drain contact regions located at both ends of the channel region in the first direction X. An orthographic projection of the channel region intersects with the gate electrode 201, an orthogonal projection pattern of the first active layer 301 on the channel region is consistent with an orthogonal projection pattern of the second active layer 302 in the channel region. That is, the orthographic projections of the first active layer 301 and the second active layer 302 on the gate electrode 201 coincide with each other, so that the channel widths formed by the first active layer 301 and the second active layer 302 are the same. The channel width is the length of the channel region in the second direction Y, and the second direction Y intersects with or is perpendicular to the first direction X. In other embodiments, the direction of the channel width may be a distance between any two opposite ends in the active layer channel region excluding the opposite ends connected to the source-drain electrode.

It should be understood that, if the orthographic projections of the first active layer and the second active layer on the gate electrode do not coincide with each other, for example, in the channel region, i.e., the region where the active layer overlaps the gate electrode, the first active layer is entirely covered by the second active layer, and the second active layer is larger than the first active layer in the channel width direction, then two types of channel regions will appear in the channel width direction, one is a region where the first active layer overlaps with the second active layer, and the other one is a region with only the second active layer. The active layer thicknesses in the two regions are different, so that the characteristics of the two regions will be different, that is, two types of thin film transistors with different characteristics are connected in parallel. This may lead to distortion of characteristic curve of the thin film transistor, and sub-channel region effect may occur.

With the array substrate provided by the embodiments of the present disclosure, the thin film transistors in different regions may have different characteristics, moreover, the thin film transistors can achieve high threshold voltage stability without leading to distortion of characteristic curve of the thin film transistor and sub-channel region effect caused by structural differences of the thin film transistors.

Further, the patterns of the first active layer 301 and the second active layer 302 in the first type of thin film transistor 210 are consistent, that is, the widths of the first active layer 301 and the second active layer 302 in the first direction X are also consistent, so as to make the active layer structure more uniform, so as to avoid the influence of different active layer thickness in each region on the characteristics of the thin film transistor.

In other embodiments of the present disclosure, the widths of the first active layer and the second active layer of the first type of thin film transistor in the first direction may not be consistent. Optionally, in the first direction, the width of the second active layer is larger than the width of the first active layer, so that the second active layer covers the first active layer in the source-drain contact region of the active layer of the first type of thin film transistor, then the source-drain electrode of the first type of thin film transistor is only in contact with the second active layer, so that the contact property of the source-drain electrode with the active layer of the first type of thin film transistor is consistent with the contact property of the source-drain electrode with the active layer of the second type of thin film transistor, thereby preventing other characteristics of the thin film transistor from being influenced.

In a method for manufacturing an array substrate according to an embodiment of the present disclosure, as shown in FIGS. 15-19, FIGS. 15-19 are schematic diagrams of process of manufacturing an array substrate according to embodiments of the present disclosure. It should be noted that, the ellipsis " . . . " shown in the following figures of the embodiments of the present disclosure means that the flexible display panel extends in the left-right direction or in the up-down direction, and the omitted parts may include other structures, which will not be limited by the embodiments of the present disclosure.

Figure 15:
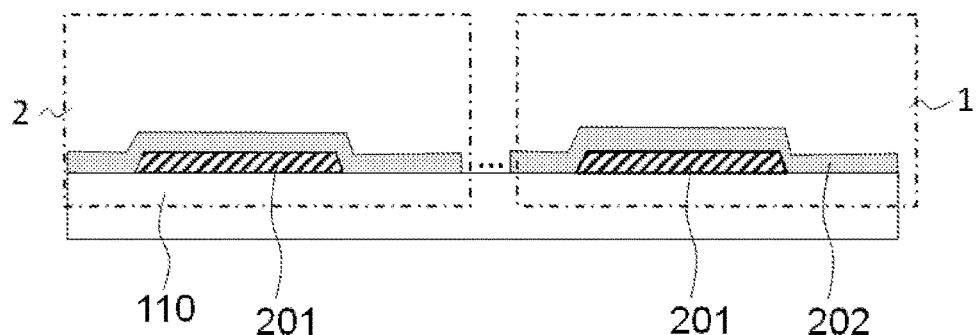
FIGS. 15-19 are schematic diagrams of process of manufacturing an array substrate according to an embodiment of the present disclosure.

First, as shown in FIG. 15, there are a first region 1 and a second region 2 above the base-substrate 110, the first region 1 is a position where a first type of thin film transistor is located, and the second region 2 is a position where the second type of thin film transistor is located. A first metal layer is formed on the base-substrate 110 and patterned, a gate electrode 201 of the first type of thin film transistor is formed in the first region 1 and a gate electrode 201 of the second type of thin film transistor is formed in the second region 2; at the first metal layer, i.e., a side of the gate electrode 201 away from the base-substrate 110, a gate insulation layer 202 covering the first type of thin film transistor and the second type of thin film transistor is formed.

Then, at a side of the gate insulation layer 202 away from the base-substrate 110, an active layer 300 of the first type of thin film transistor and an active layer 300 of the second type of thin film transistor are respectively formed in the first region 1 and in the second region 2.

Figure 16:
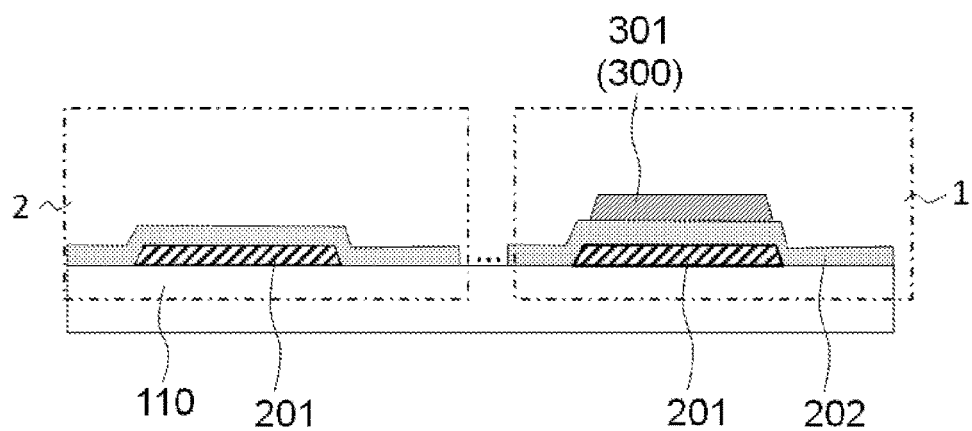

Specifically, as shown in FIG. 16, an oxide semiconductor layer, i.e., the first active layer 301, is first formed on the gate insulation layer 202. The oxide semiconductor material may be any one of IGZO, ITZO, IGZTO, IGO and IAZO, or any combination thereof The oxide semiconductor film is patterned. The portion of the oxide semiconductor layer that overlaps with the gate electrode 201 of the first type of thin film transistor may be remained by a process such as exposing, developing, etching, or the like, and the other portions that overlap with other devices of the first type of thin film transistor are removed, so that a portion of the active layer 300 of the first type of thin film transistor is formed.

Figure 17:
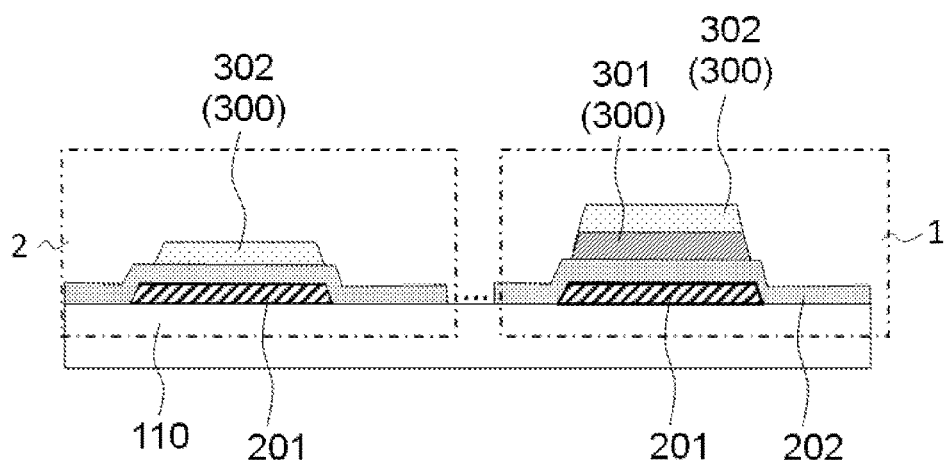

Then, as shown in FIG. 17, another oxide semiconductor layer, i.e., the second active layer 302, is further formed on a side of the first active layer 301 facing away from the base-substrate 110. The oxide semiconductor material may be any one of IGZO, ITZO, IGZTO, IGO and IAZO, or any combination thereof. Portions of the oxide semiconductor layer that respectively overlap with the gate electrode 201 of the first type of thin film transistor and overlap with the gate electrode 201 of the second type of thin film transistor are remained by a process such as exposing, developing, etching, or the like, and then the active layer 300 of the second type of thin film transistor 220 is formed and another part of the active layer 300 of the first type of thin film transistor is formed.

Figure 18:
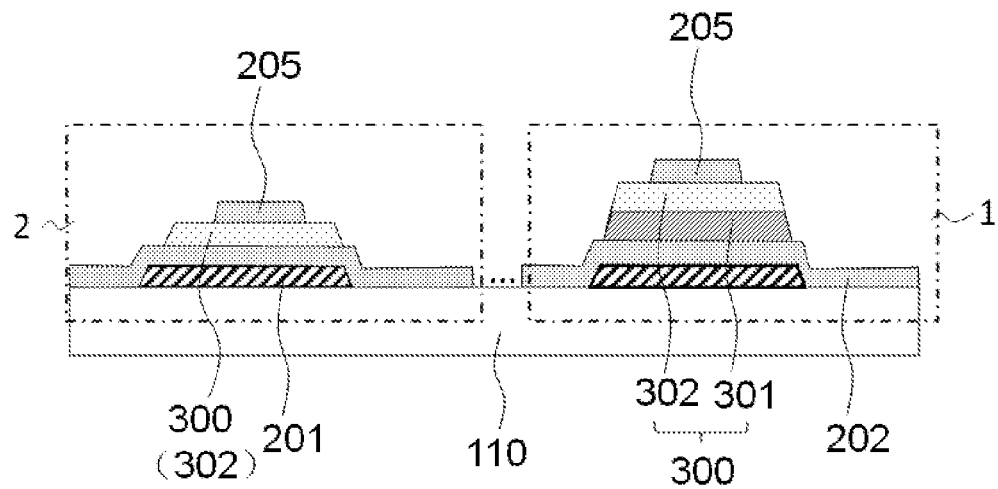

After the active layer of the thin film transistor is completed, as shown in FIG. 18, an insulation layer, i.e., the etch barrier layer 205, is formed on a side of the active layer 300 away from the base-substrate 110. The etch barrier layer 205 is patterned so as to expose the source contact region and the drain contact region of the active layer 300.

Figure 19:
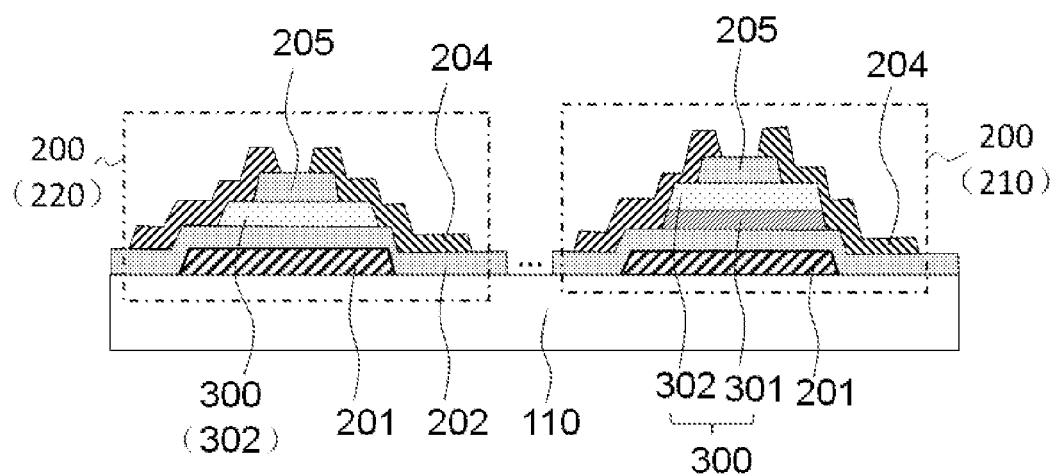

Then, as shown in FIG. 19, a second metal layer, i.e., the source-drain electrode 204, is formed on the etch barrier layer 205, and the second metal layer is patterned so as to form a source electrode and a drain electrode that are spaced from each other. The source electrode and the drain electrode are respectively in contact with the source contact region and the drain contact region of the active layer 300 so as to form a first type of thin film transistor 210 and a second type of thin film transistor 220 that satisfy different characteristic requirements. The etch barrier layer 205 may be used to prevent the active layer 300 from being over-etched when the second metal layer is patterned and etched.

With the method for manufacturing an array substrate provided by the embodiments of the present disclosure, the thin film transistors in different regions may have different characteristics, so as to satisfy different requirements of the circuits in different regions on characteristics of the thin film transistor devices, so that both the requirement for high threshold voltage stability in some positions and the requirement for high threshold voltage in some positions can be satisfied, and thus the thin film transistors in different positions in the circuit can work better with the circuit to better perform the functions and play the roles, so that a signal output from the circuit in the array substrate during working is more accurate and reliable. Moreover, with the array substrate provided in the embodiments of the present disclosure, thin film transistors satisfying different requirements do not need to be manufactured in batches while the circuit reliability is improved, without increasing the process window. The efficiency and yield are improved while the costs have been reduced.

Figure 20:
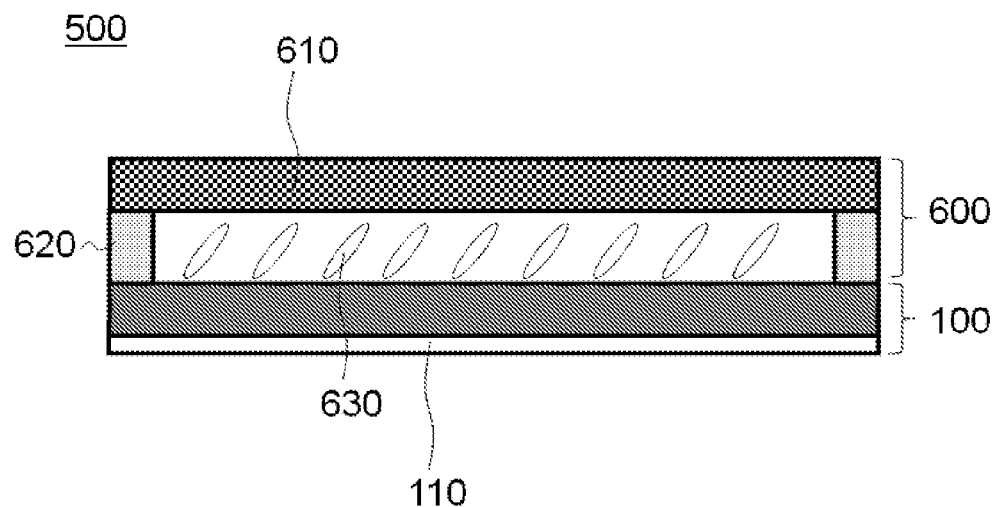
FIG. 20 is a schematic diagram of a display panel according to an embodiment of the present disclosure.

As shown in FIG. 20, FIG. 20 is a schematic diagram of a display panel according to an embodiment of the present disclosure. The display panel 500 includes the array substrate 100 described in any one of the above embodiments and a display function layer 600 located on a side of the array substrate 100 away from the base-substrate 110.

Optionally, the display panel is a liquid crystal display panel. The display function layer 600 includes a color film substrate 610 disposed opposite to the array substrate 100 and a liquid crystal layer 630 sealed between the array substrate and the color film substrate by a sealant 620.

Figure 21:
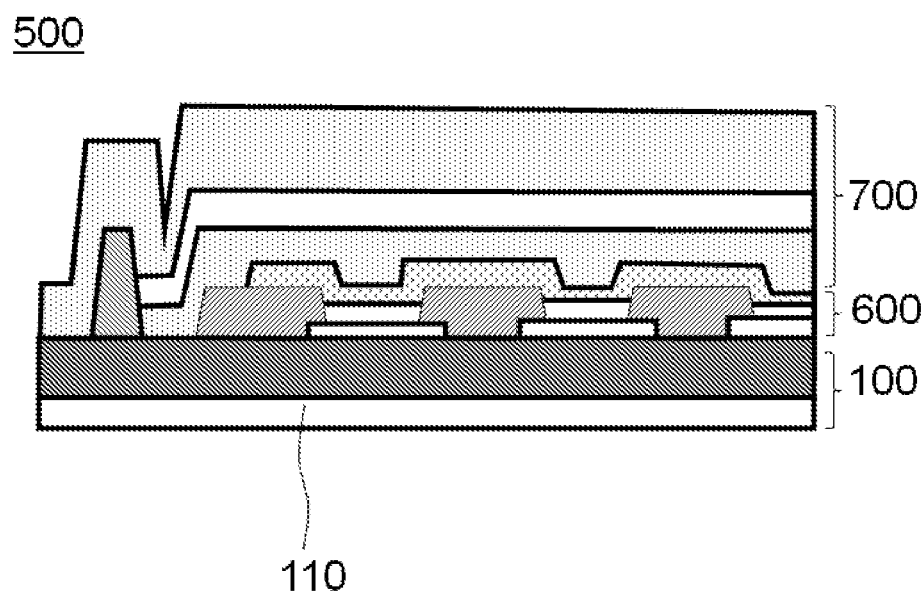
FIG. 21 is a schematic diagram of another display panel according to an embodiment of the present disclosure.

In other embodiments, as shown in FIG. 21, FIG. 21 is a schematic diagram of another display panel according to an embodiment of the present disclosure. The display panel may be an organic light-emitting display panel. The display function layer 600 includes an anode layer, an organic light-emitting layer, a cathode layer and a thin film encapsulation layer sequentially stacked in a direction away from the array substrate 100. A pixel defining layer may also be included between the anode layer and the organic light-emitting layer, and the pixel defining layer includes a plurality of apertures exposing the anode layer, the organic light-emitting layer is in contact with the anode layer via the apertures. Since organic material in the display functional layer 600 is very sensitive to oxygen and moisture, the display panel further includes an encapsulation layer 700 on a side of the display function layer 600 away from the array substrate 100 so as to encapsulate the organic light-emitting display device.

Figure 22:
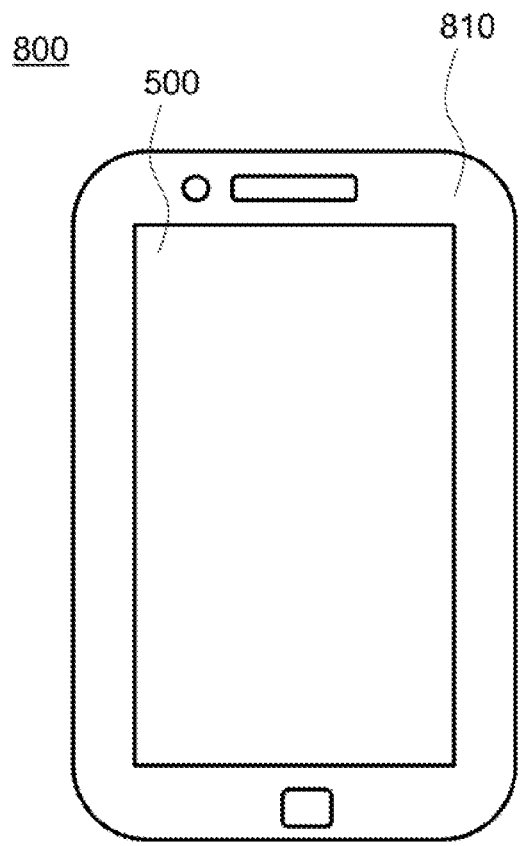
FIG. 22 is a schematic diagram of a display apparatus according to an embodiment of the present disclosure.

As shown in FIG. 22, FIG. 22 is a schematic diagram of a display apparatus according to an embodiment of the present disclosure. The display apparatus 800 includes the display panel 500 described in the above embodiments, and a housing 810 that protects the display panel 500.

The above contents are further descriptions of the present disclosure in combination with preferred embodiments, and it should not be considered that the implementation of the present disclosure is limited by these descriptions. For those skilled in the art, simple deductions or replacements may be made without departing from the concept of the present disclosure and should all be regarded as belonging to the protection scope of the present disclosure.

What is claimed is:

1. An array substrate, comprising a base-substrate and a plurality of circuit structures disposed on a side of the base-substrate;
   wherein the plurality of circuit structures comprises a pixel driving circuit located in a display region and a peripheral driving circuit surrounding the display region;
   the plurality of circuit structures comprises a plurality of thin film transistors comprising a first type of thin film transistor and a second type of thin film transistor, and each of the plurality of thin film transistors comprises a gate electrode, a gate insulation layer, an active layer of an oxide semiconductor comprising at least one sub-layer, and a source-drain electrode stacked in a direction perpendicular to the base-substrate;
   the active layer of the first type of thin film transistor has more sub-layers than that of the active layer of the second type of thin film transistor, a total thickness of the active layer of the first type of thin film transistor is larger than a total thickness of the active layer of the second type of thin film transistor, and each sub-layer of the active layer of the second type of thin film transistor is in a same layer as the active layer of the first type of thin film transistor;
   the first type of thin film transistor is electrically connected into the pixel driving circuit, and is configured to output a driving signal for controlling brightness of a display device; and
   the second type of thin film transistor is electrically connected into the peripheral driving circuit, and is configured to output a scanning signal.

2. The array substrate according to claim 1, wherein
   the first type of thin film transistor is directly electrically connected to a display device in the pixel driving circuit; and
   the second type of thin film transistor is directly electrically connected to an output of the peripheral driving circuit.

3. The array substrate according to claim 2, further comprising a first active layer and a second active layer that are stacked in a direction perpendicular to the base-substrate; wherein
   the active layer of the first type of thin film transistor is a double-layer structure, which is in a same layer as the first active layer and the second active layer; and
   the active layer of the second type of thin film transistor is a single-layer structure, which is in a same layer as the second active layer.

4. The array substrate according to claim 1, wherein
   the active layer of the first type of thin film transistor is divided into a first part and a second part, wherein the first part is in a same layer as the active layer of the second type of thin film transistor, and the second part is in different layers from the active layer of the second type of thin film transistor, and that the first part is located on a side of the second part facing away from the base-substrate.

5. The array substrate according to claim 1, further comprising a first active layer and a second active layer that are stacked in a direction perpendicular to the base-substrate; wherein
   the active layer of the first type of thin film transistor is a double-layer structure, which is in a same layer as the first active layer and the second active layer, respectively; and
   the active layer of the second type of thin film transistor is a single-layer structure, which is in a same layer as the second active layer.

6. The array substrate according to claim 5, wherein
   in the first type of thin film transistor, an orthographic projection of the second active layer on the base-substrate covers an orthographic projection of the first active layer on the base-sub state.

7. The array substrate according to claim 5, wherein
   each active layer of the first type of thin film transistor comprises a channel region and a source-drain contact region located at both ends of the channel region; an orthographic projection of the first active layer on the channel region is consistent with an orthographic projection of the second active layer on the channel region.

8. The array substrate according to claim 5, wherein
   a thickness of the first active layer is smaller than a thickness of the second active layer.

9. The array substrate according to claim 5, wherein
   a thickness of the second active layer ranges from 300 Å to 500 Å.

10. The array substrate according to claim 9, wherein
    the thickness of the second active layer is 400 Å.

11. The array substrate according to claim 9, wherein
    a thickness of the first active layer ranges from 50 Å to 200 Å.

12. The array substrate according to claim 1, wherein
    a difference between the total thickness of the active layer of the first type of thin film transistor and the total thickness of the active layer of the second type of thin film transistor ranges from 10 Å to 500 Å.

13. The array substrate according to claim 1, wherein
    a gate electrode of the first type of thin film transistor is in a same layer as a gate electrode of the second type of thin film transistor;
    a gate insulation layer of the first type of thin film transistor is in a same layer as a gate insulation layer of the second type of thin film transistor;
    a source-drain electrode of the first type of thin film transistor is in a same layer as a source-drain electrode of the second type of thin film transistor.

14. The array substrate according to claim 1, wherein
    positions at which the plurality of thin film transistors is located in the plurality of circuit structures comprise a first position, during working of the plurality of circuit structures, one of the plurality of thin film transistors located at the first position is in a positive bias state for a longer time than being in a negative bias state, and the one of the plurality of thin film transistors located at the first position is the first type of thin film transistor.

15. The array substrate according to claim 1, wherein
    positions at which the plurality of thin film transistors is located in the plurality of circuit structures further comprise a second position, during working of the plurality of circuit structures, one of the plurality of thin film transistors located at the second position has a voltage difference between its gate electrode and its source electrode, which is zero for a longer time than being positive, and the one of the plurality of thin film transistors located at the second position is the second type of thin film transistor.

16. The array substrate according to claim 1, wherein positions at which the plurality of thin film transistors is located in the plurality of circuit structures further comprise a third position, during working of the plurality of circuit structures, one of the plurality of thin film transistors located at the third position is used to provide a signal to a device that needs to respond to a precise signal, and the one of the plurality of thin film transistors located at the third position is the first type of thin film transistor.

17. A display panel, comprising an array substrate and a display function layer, wherein the array substrate comprises a base-substrate and a plurality of circuit structures disposed on a side of the base-substrate;
wherein the plurality of circuit structures comprises a pixel driving circuit located in a display region and a peripheral driving circuit surrounding the display region;
the plurality of circuit structures comprises a plurality of thin film transistors comprising a first type of thin film transistor and a second type of thin film transistor, and each of the plurality of thin film transistors comprises a gate electrode, a gate insulation layer, an active layer of an oxide semiconductor comprising at least one sub-layer, and a source-drain electrode stacked in a direction perpendicular to the base-substrate;
the active layer of the first type of thin film transistor has more sub-layers than that of the active layer of the second type of thin film transistor, a total thickness of the active layer of the first type of thin film transistor is larger than a total thickness of the active layer of the second type of thin film transistor, and each sub-layer of the active layer of the second type of thin film transistor is in a same layer as the active layer of the first type of thin film transistor;
the first type of thin film transistor is electrically connected into the pixel driving circuit, and is configured to output a driving signal for controlling brightness of a display device; and
the second type of thin film transistor is electrically connected into the peripheral driving circuit, and is configured to output a scanning signal,
the display function layer is disposed on a side of the array substrate away from the base-sub state.

18. A display apparatus, comprising a display panel, wherein the display panel comprises an array substrate and a display function layer, wherein the array substrate comprises base-substrate and a plurality of circuit structures disposed on a side of the base-substrate;
wherein the plurality of circuit structures comprises a pixel driving circuit located in a display region and a peripheral driving circuit surrounding the display region;
the plurality of circuit structures comprises a plurality of thin film transistors comprising a first type of thin film transistor and a second type of thin film transistor, and each of the plurality of thin film transistors comprises a gate electrode, a gate insulation layer, an active layer of an oxide semiconductor comprising at least one sub-layer, and a source-drain electrode stacked in a direction perpendicular to the base-substrate;
the active layer of the first type of thin film transistor has more sub-layers than that of the active layer of the second type of thin film transistor, a total thickness of the active layer of the first type of thin film transistor is larger than a total thickness of the active layer of the second type of thin film transistor, and each sub-layer of the active layer of the second type of thin film transistor is in a same layer as the active layer of the first type of thin film transistor;
the first type of thin film transistor is electrically connected into the pixel driving circuit, and is configured to output a driving signal for controlling brightness of a display device; and
the second type of thin film transistor is electrically connected into the peripheral driving circuit, and is configured to output a scanning signal,
the display function layer is disposed on a side of the array substrate away from the base-sub state.

19. A method for manufacturing an array substrate, comprising:
forming, on a side of a base-substrate, a gate electrode, a gate insulation layer, an active layer of an oxide semiconductor and a source-drain electrode for a first type of thin film transistor and a second type of thin film transistor, respectively;
wherein the active layer of the first type of thin film transistor has more sub-layers than that of the active layer of the second type of thin film transistor, a total thickness of the active layer of the first type of thin film transistor is larger than a total thickness of the active layer of the second type of thin film transistor, and each sub-layer of the active layer of the second type of thin film transistor is in a same layer as the active layer of the first type of thin film transistor,
wherein forming the active layer of the first type of thin film transistor and the second type of thin film transistor further comprises:
forming a first active layer on the side of the base-substrate, and patterning the first active layer to form a part of the active layer of the first type of thin film transistor; and
forming a second active layer on a side of the first active layer away from the base-substrate, and patterning the second active layer to form the active layer of the second type of thin film transistor and another part of the active layer of the first type of thin film transistor.

20. The method according to claim 19, comprising:
forming a first metal layer on the base-substrate and patterning the first metal layer to form a gate electrode of the first type of thin film transistor and a gate electrode of the second type of thin film transistor;
forming, on a side of the first metal layer away from the base-substrate, a gate insulation layer covering the first type of thin film transistor and the second type of thin film transistor; and
forming, on a side of the gate insulation layer away from the base-substrate, the active layer of the first type of thin film transistor and the active layer of the second type of thin film transistor.

* * * * *